United States Patent [19]

Marz

[11] Patent Number: 4,816,781

[45] Date of Patent: Mar. 28, 1989

[54] FM MODULATOR

[75] Inventor: Daniel Marz, Dresher, Pa.

[73] Assignee: General Instrument Corporation, New York, N.Y.

[21] Appl. No.: 65,367

[22] Filed: Jun. 22, 1987

[51] Int. Cl.[4] .............................................. H03C 3/09
[52] U.S. Cl. ......................................... 332/19; 331/23
[58] Field of Search .............. 331/23; 332/19; 358/23; 455/75, 113, 119

[56] References Cited

U.S. PATENT DOCUMENTS 4,707,670 11/1987 Dalcin .................................... 332/19

Primary Examiner—Gene Wan
Attorney, Agent, or Firm—Hopgood, Calimafde, Kalil, Blaustein & Judlowe

[57] ABSTRACT

Circuitry for producing an extremely linear frequency modulated audio carrier for use in the head end of a video signal distribution system, such as a cable television system. A reference oscillator operating at a relatively high frequency, such as the video carrier frequency, generates a signal which is divided down to a relatively low frequency. A voltage controlled oscillator operating at the relatively low frequency is used to frequency modulate the audio signal. After modulation, the audio carrier is upconverted utilizing a signal frequency which is also derived from the original reference frequency, thus providing a stable and linear frequency modulated audio carrier particularly suitable for transmission of stereo program audio.

14 Claims, 2 Drawing Sheets

FM MODULATOR

BACKGROUND OF THE INVENTION

This invention relates to a circuit for producing an extremely linear frequency modulated audio carrier for use in a video signal distribution system, such as a cable television system.

The headend of a cable television distribution system frequency modulates the program audio onto a carrier which is offset 4.5 MHz from the program video carrier. In the past, headend distribution systems have utilized vaiable oscillators for generating the frequency modulated audio carrier. The variable oscillators have generally been voltage controlled oscillators operated at RF frequencies (i.e. above 1 MHz). The linearity of the audio carrier produced by such circuitry, although generally suitable for use with monaural audio signals of a limited frequency bandwidth, i.e., up to 20 KHz, has been less than completely satisfactory.

Television programming with stereo rather than monaural program audio has recently become available. Stereo audio signals, which include higher frequency components to carry the additional stereo information (L-R) and a second audio program (SAP), have an increased frequency bandwidth on the order of 100 KHz. A stereo audio FM modulator requires precise phase and frequency linear modulation of the audio carrier because any intermodulation between the signal components due to modulator non-linearity will result in noticeably degraded stereo reception. Accordingly, an FM modulator suitable for use with frequency modulated stereo audio signals must be extremely linear. The prior circuits for generating the modulated audio carrier in video signal distribution systems have been found wanting for quality stereo transmission.

The non-linearity of the audio carrier modulation results from the use of an inherently non-linear voltage controlled oscillator in generating the modulated audio carrier. Voltage controlled oscillators operating above 1 MHz are inherently non-linear due to the use of varactor technology. Indeed, voltage controlled oscillators operating at RF frequencies utilize "linearization" networks to improve linearity. However, a linearization network is also inherently non-linear. Thus, the output of the voltage controlled oscillator is insufficiently linear. Accordingly, prior headend systems using voltage controlled oscillators operating at RF frequencies do not have sufficient linearity for modulating a stereo audio carrier.

U.S. Pat. No. 4,546,387 (Glaab) issued on Oct. 8, 1985 and is assigned to the assignee herein. The Glaab patent illustrates circuitry for providing accurate spacing of video and audio carriers. While the circuitry disclosed in Glaab does provide very accurately spaced carriers, it is noted that its voltage controlled oscillators operate at above 60 MHz. Accordingly, such oscillators would be insufficiently linear to provide accurate frequency modulation of a stereo audio signal. The present invention utilizes voltage controlled oscillators operating below 1 MHz to provide accurately spaced and extremely linear FM modulated audio.

Accordingly, it is an object of this invention to provide an improved FM modulator.

It is another object of this invention to provide an FM modulator having an extremely linear modulation characteristic.

It is another object of this invention to provide a video signal distribution system in which the audio carrier frequency is derived from the video carrier frequency.

It is a further object of this invention to provide audio FM modulation on a video signal particularly suitable for stereo audio transmission.

It is a further object of this invention to provide a television signal with stereo audio having accurately spaced video and audio carriers.

SUMMARY OF THE INVENTION

The present invention is directed to circuitry for providing an extremely linear audio FM modulator for use in a cable television or broadcast distribution system. It has been found that voltage controlled oscillators using current switching techniques and operating below 1 MHz are inherently linear, since they do not utilize varactor technology. Accordingly, in the present invention a relatively high frequency signal derived from a reference crystal oscillator is divided down to a relatively low frequency and a linear voltage controlled oscillator is used to frequency modulate the audio carrier at this relatively low frequency. This provides extremely linear frequency modulated audio which is more stable than that provided by previous means. After modulation, the audio carrier is upconverted utilizing a signal frequency which is also derived from the original reference signal. The relatively high frequency reference signal may also be used to drive the video modulator, in which case the spacing between the video and audio carriers is accurately controlled.

BRIEF DESCRIPTION OF THE DRAWINGS

In order to better understand the invention, reference is made to the following drawings, which are to be taken in connection with the detailed specification to follow in which.

DESCRIPTION OF THE PREFERRED EMBODIMENTS

Figure 1:
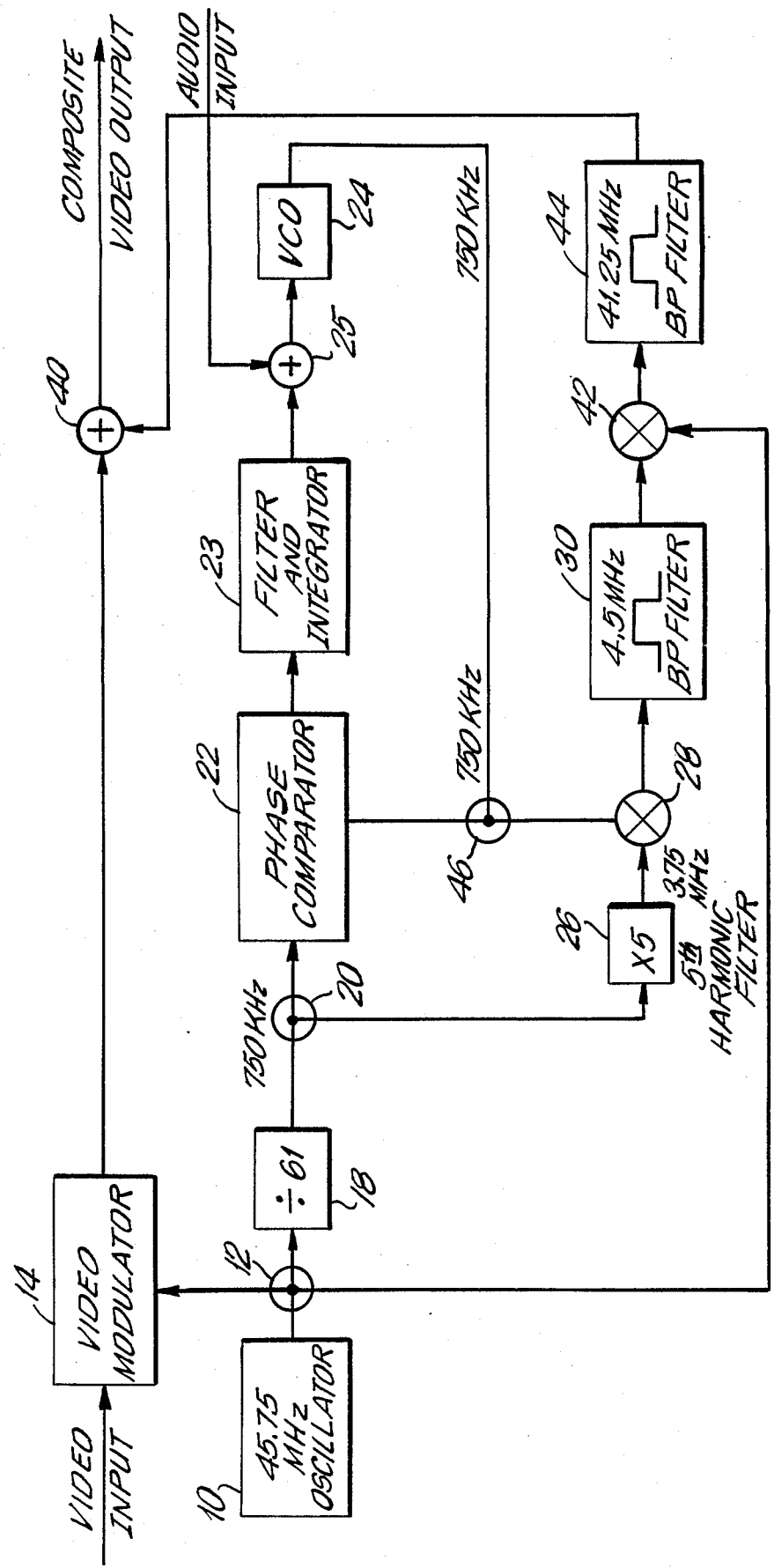
FIG. 1 is schematic block diagram of an FM modulator in accordance with the present invention for use in a video signal modulator for providing an extremely linear audio modulated carrier and FIG. 2 is a schematic block diagram of alternative embodiment of the invention having a reduced component count for generating a frequency modulated audio carrier directly at RF Video frequency.

Referring to FIG. 1 the circuit in accordance with the invention comprises a reference 45.75 MHz crystal oscillator 10 whose output is applied to a splitter 12. The 45.75 MHz output frequency of oscillator 10 is the video carrier IF frequency, accordingly an output of splitter 12 is applied to a video modulator 14 which also receives the video signal as an input. The other output of splitter 12 is applied to a frequency divider 18 which divides the 45.75 MHz reference frequency by a factor of 61 to provide a 750 KHz output. Frequency modulation of the audio carrier is thereafter performed by a variable oscillator such as a phase locked loop voltage controlled oscillator (VCO) operating at the 750 MHz frequency, that is, at a relatively low frequency (less than 1 MHz) which permits the use of an inherently linear variable oscillator.

Suitable VCO's for use in practicing this invention are VCO model VFC-62 manufactured by Burr-Brown of Tucson, Ariz., the AD-650 from Analog Devices, Norwood, Mass. or the EXAR 2206 from Exar Corp., Sunnyvale, Calif. Of course, other makes of linear VCO's may also be used. It is to be understood that the frequencies specified in the following description of the invention are exemplary and not limiting of the invention. Furthermore, the multiplication/division factors of the frequency multipliers/dividers are also exemplary and not intended to be limiting.

The 750 KHz output of frequency divider 18 is applied to a splitter 20 and one output of splitter 20 is applied to the input of a phase comparator 22. The output of phase comparator 22 represents the "error signal" of a phase locked loop and is applied to a filter and/or integrator 23. The output of filter and integrator 23 is applied to a combiner 25 which also receives the audio signal to be frequency modulated. The output of combiner 25 representing the error signal and the audio signal is applied to voltage controlled oscillator 24 operating at a 750 KHz center frequency. The output of VCO 24 is applied via a splitter 46 to phase comparator 22. Phase comparator 22, filter and integrator 23 and VCO 24 form a phase locked loop to provide an FM modulated audio signal at a 750 KHz center frequency.

The 750 KHz output of frequency divider 18 is also applied via splitter 20 to a five times frequency multiplier 26 to provide a 3.75 MHz output. Frequency multiplier 26 may be any suitable multiplier such as a fifth harmonic filter and amplifier. The 3.75 MHz output of frequency multiplier 26 is applied to a mixer 28 which also receives the 750 KHz output of voltage controlled oscillator 24 from splitter 46. Accordingly, the output of mixer 28 includes signals of both the sum (4.5=3.75+0.75 MHz) and difference (3.0=3.75−0.75 MHz) of the input signals. The output of mixer 28 is applied to 4.5 MHz band pass filter 30 so as to retrieve only the 4.5 MHz FM output, which is audio carrier's offset from the video carrier. The output of band pass filter 30 is applied to a mixer 42 which also receives via splitter 12 the 45.75 MHz output of oscillator 10. The output of mixer 42 thus comprises the sum and difference of the 45.75 MHz and 4.5 MHz signals which is applied to a 41.25 MHz band pass filter 44 to retrieve the difference signal of 41.25 MHz. The output of band pass filter 44 is applied to combiner 40 which also receives the output of video modulator 14. Accordingly, the output of combiner 40 is the composite video signal. It is noted that because the video and audio carrier signals are derived from a single source, reference oscillator 10, the video and audio carriers will be very accurately spaced.

Figure 2:
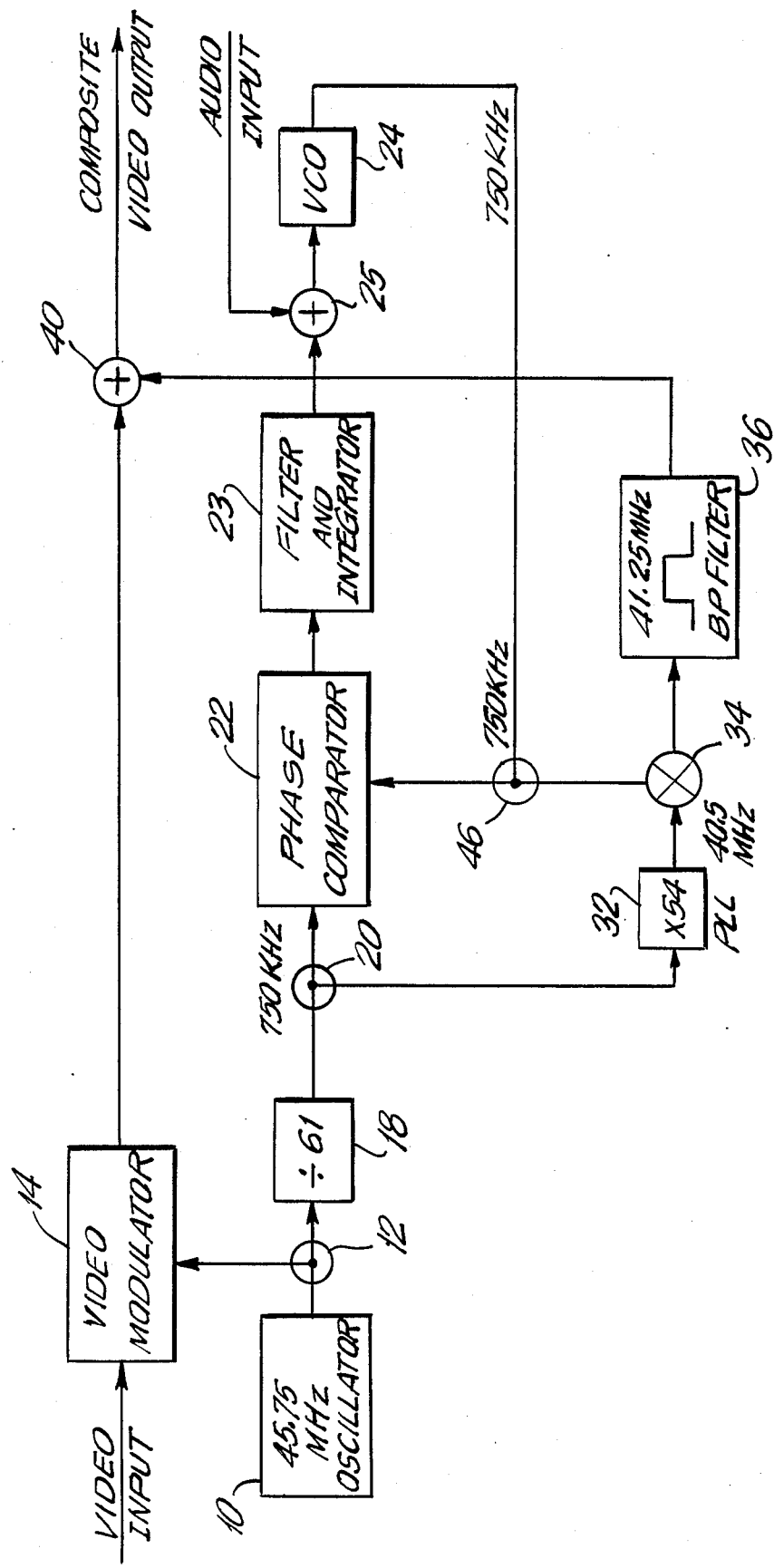

FIG. 2 illustrates alternative circuitry to accomplish the same result as that of FIG. 1 with a reduced component count. In FIG. 2 the same reference numerals have been used to indicate components that are the same as FIG. 1. In FIG. 2 the 5X multiplier 26 is replaced with a PLL 32 operating as a 54 times frequency multiplier whose input is supplied by splitter 20 with the 750 KHz output of frequency divider 18. Accordingly, the output of PLL 32 is a 40.5 MHz signal which is applied to a mixer 34 which also receives as an input the 750 MHz FM modulated output of voltage controlled oscillator 24. The output of mixer 34 is applied to a 41.25 MHz band pass filter 36 to extract the additive frequency component and to provide a 41.25 MHz frequency modulated audio subcarrier which is applied to combiner 40 to provide the composite television signal.

In FIG. 2, the need for 4.5 MHz band pass filter 30 and mixer 42 is eliminated and X5 frequency multiplier 26 is replaced with a PLL X54 frequency multiplier which produces 41.25 MHz FM audio which can be directly summed with the modulated video without the need for further mixing with the reference signal. While FIG. 2 contains fewer circuit components than does FIG. 1 it is noted that X5 multiplier 26 may be a relatively inexpensive fifth harmonic filter, while X54 multiplier 32 is a more costly PLL circuit. Accordingly, the circuitry of FIG. 2 is suitable where reduced component count is desirable, with the circuitry of FIG. 1 utilized where lower cost is paramount.

The above described circuits provide an ultra linear audio FM signal by the use of a relatively low frequency voltage controlled oscillator 24. Furthermore, the low frequency signal is derived by dividing the video IF reference frequency. The output of voltage controlled oscillator 24 is mixed with a frequency which is based on the same reference signal thus producing ultra linear 4.5 KHz modulated FM.

It will thus be understood that where as the circuit of the invention has been hereinabove described with respect to presently preferred embodiments. However, modifications in the circuit may be made without necessarily departing from the spirit and scope of the invention.

What is claimed is:

1. A circuit for producing a frequency modulated audio carrier in a video signal distributor system, said circuit comprising:
   means for generating a first reference frequency signal;
   divider means connected to said generator means for dividing said first reference frequency signal down to a relatively low frequency signal;
   variable oscillator means receiving the output of said divider means and operating at said relatively low frequency having a control input for receiving an amplitude modulated audio signal, said variable oscillator having an output providing a frequency modulated signal at the frequency of said relatively low frequency signal; and
   means connected to said variable oscillator means for upconverting said output of said variable oscillator to an audio carrier frequency, wherein said upconverting means comprises means for generating a second reference frequency signal from said first reference frequency signal.

2. The circuit as claimed in claim 1 wherein said upconverting means comprises means for mixing said output of said variable oscillator with said second reference frequency signal.

3. The circuit as claimed in claim 2 wherein said second reference frequency generating means includes 4. The circuit as claimed in claim 4 wherein said frequency multiplier is a harominc filter.

5. The circuit as claimed in claim 5 wherein said frequency multiplier comprises a phase locked loop.

6. The circuit as claimed in claim 1 wherein said variable oscillator comprises a voltage controlled oscillator including a phase locked loop to control the nominal center frequency of said voltage controlled oscillator.

7. The circuit as claimed in claim 1 wherein said first reference frequency signal is 45.75 MHz and said relatively low frequency signal comprises a 750 KHz signal.

8. The circuit as claimed in claim 1 wherein said first reference frequency generating means comprises a crystal oscillator.

9. The circuit as claimed in claim 1 wherein said first reference frequency signal is applied to a video modulator for providing a video carrier.

10. The circuit as claimed in claim 10 wherein said video modulator includes an output connected to a combiner, said output of said variable oscillator means also being applied to said combiner to thereby provide a composite television signal as an ouput of said combiner.

11. A method for producing a frequency modulated audio carrier in a video signal distributor system, said method comprising the steps of:

generating a first reference frequency signal;

dividing said first reference frequency signal down to a relatively low frequency signal;

operating a voltage controlled oscillator at said lower frequency;

applying an amplitude modulated audio signal to said voltage control oscillator to obtain a frequency modulated signal at said relatively low frequency; and upconverting said frequency modulated signal of said voltage controlled oscillator to an audio carrier frequency, wherein said upconverting step includes the steps of generating a second reference frequency signal from said first reference frequency signal.

12. The method as claimed in claim 10 wherein said upconverting step includes the step of mixing said output of said voltage controlled oscillator with said second reference frequency signal.

13. The method as claimed in claim 11 wherein said first refernce frequency signal is generated at 45.75 MHz and said relatively low frequency signal comprises a 750 KHz signal.

14. The method as claimed in claim 13 further includes the step of combining said frequency moudlated audio signal with a video signal to provide a composite television signal.

* * * * *